US008674457B2

(12) United States Patent
Toh et al.

(10) Patent No.: US 8,674,457 B2
(45) Date of Patent: Mar. 18, 2014

(54) METHODS TO REDUCE GATE CONTACT RESISTANCE FOR AC REFF REDUCTION

(75) Inventors: Eng Huat Toh, Singapore (SG); Elgin Quek, Singapore (SG); Chunshan Yin, Singapore (SG); Chung Foong Tan, Singapore (SG); Jae Gon Lee, Singapore (SG)

(73) Assignee: Globalfoundries Singapore PTE., Ltd., Singapore (SG)

( * ) Notice: Subject to any disclaimer, the term of this patent is extended or adjusted under 35 U.S.C. 154(b) by 463 days.

(21) Appl. No.: 12/806,354

(22) Filed: Aug. 11, 2010

(65) Prior Publication Data
US 2012/0038009 A1 Feb. 16, 2012

(51) Int. Cl.
*H01L 21/336* (2006.01)
*H01L 29/78* (2006.01)

(52) U.S. Cl.
USPC ............ 257/410; 257/E29.165; 257/E21.409; 438/287

(58) Field of Classification Search
USPC ............ 257/E29.165, E21.409, 410; 438/287
See application file for complete search history.

(56) References Cited

U.S. PATENT DOCUMENTS

| | | | | |
|---|---|---|---|---|
| 6,340,827 B1 * | 1/2002 | Choi et al. | | 257/310 |
| 2002/0153579 A1 * | 10/2002 | Yamamoto | | 257/412 |
| 2002/0190302 A1 * | 12/2002 | Bojarczuk et al. | | 257/310 |
| 2003/0141560 A1 * | 7/2003 | Sun | | 257/410 |
| 2004/0084736 A1 * | 5/2004 | Harada | | 257/410 |
| 2005/0051857 A1 * | 3/2005 | Kawahara et al. | | 257/411 |
| 2008/0261368 A1 * | 10/2008 | Ramin et al. | | 438/287 |
| 2009/0263950 A1 * | 10/2009 | Koyama et al. | | 438/287 |
| 2010/0084718 A1 * | 4/2010 | Liu et al. | | 257/410 |
| 2010/0317185 A1 * | 12/2010 | Vos et al. | | 438/591 |

* cited by examiner

*Primary Examiner* — Steven J Fulk (57) ABSTRACT

A method (and semiconductor device) of fabricating a semiconductor device provides a field effect transistor (FET) with reduced gate contact resistance (and series resistance) for improved device performance. An impurity is implanted or deposited in the gate stack in an impurity region between the metal gate electrode and the gate contact layer. An anneal process is performed that converts the impurity region into a segregation layer which lowers the schottky barrier height (SBH) of the interface between the metal gate electrode (e.g., silicide) and gate contact layer (e.g., amorphous silicon). This results in lower gate contact resistance and effectively lowers the device's AC Reff.

18 Claims, 5 Drawing Sheets

METHODS TO REDUCE GATE CONTACT RESISTANCE FOR AC REFF REDUCTION

TECHNICAL FIELD

The present disclosure relates generally to devices and methods of fabrication of semiconductor devices, and more particularly to the fabrication of field-effect transistors (FETs) with reduced gate contact resistance.

BACKGROUND

Continuous scaling of the gate dielectric in metal-oxide semiconductor (MOS) devices, along with its undesired increase in leakage current, has resulted in the evolution of high-K/metal gate stacks. These stacks are constructed either by forming the gate first or forming the gate last. In the gate first approach, the gate stack typically includes an amorphous silicon (a-Si) electrode on the metal gate with high dielectric (high-K) material, and the a-Si is formed after the high-K/metal gate is formed.

Figure 1A:
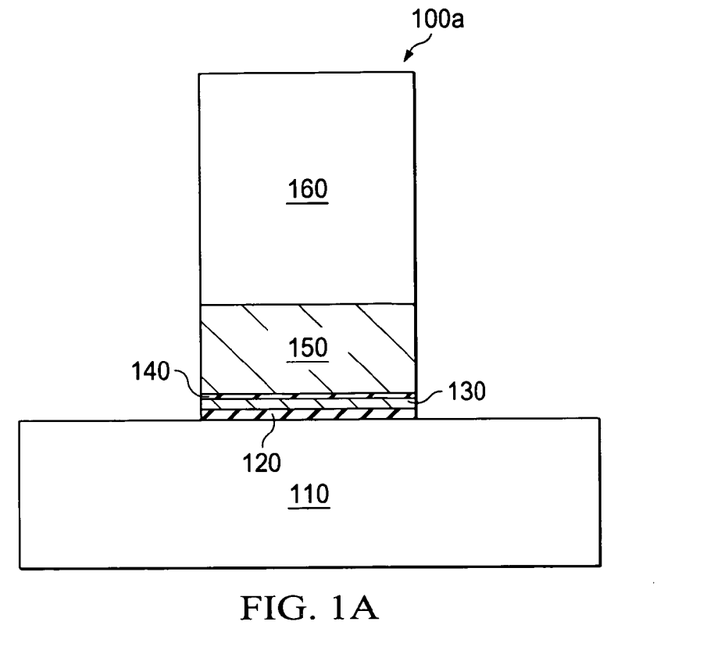
FIG. 1A illustrates an ideal prior art high-K/metal gate stack formed using a gate first approach.
Figure 1B:
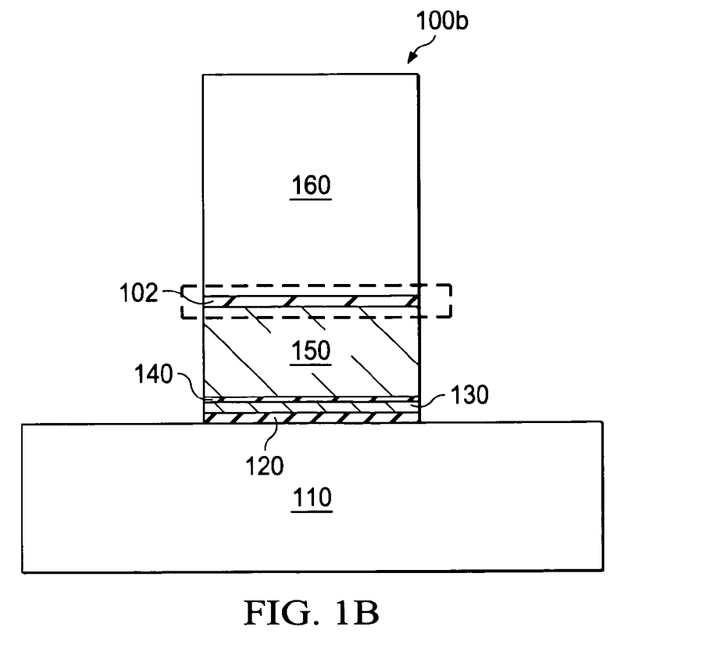
FIG. 1B illustrates an actual prior art high-K/metal gate stack formed using the gate first approach.

Referring to FIGS. 1A and 1B, there are illustrated prior art high-K/metal gate stacks 100a, 100b formed using a gate first approach. The gate stack 100a illustrated in FIG. 1A is an ideal high-K/metal gate stack, while the gate stack 100b illustrated in FIG. 1B shows the actual structure of such a gate stack. During a-Si deposition, a thin layer of native oxide 102 forms at the a-Si/metal interface as shown in FIG. 1B. This oxide layer 102 increases the gate contact resistance and in particular, increases the AC Reff. AC Reff is a measure of resistance to alternating current.

In these prior art high-K/metal gate stacks 100a, 100b, the gate stack is disposed on a substrate 110, and the stacks typically include the following layers: silicon oxynitride (SiON) 120, hafnium silicon oxynitride (HfSiON) 130, lanthanum oxide ($La_2O_3$) 140, titanium nitride (TiN) 150 and amorphous silicon (A-Si) 160. The FET gate stack shown in FIGS. 1A, 1B is a typical gate stack for an nFET. For pFET, the lanthanum oxide could be replaced with a combination, such as TiN/Al/TiN. As will be appreciated, different manufacturers may utilize different gate stack structures with different high-K materials.

One method of reduce the oxide layer 102 is to control the oxygen flow during the a-Si deposition process. However, the AC Reff is still high. One method may be to utilize pre-doping in the a-Si gate. This may result in a reduction of AC Reff of about 150 ohms (at a fixed DC Reff when pre-doping is introduced in the a-Si region of a pFET). Another method is to increase the source/drain (S/D) doping, which effectuates an increase in doping within the a-Si region. This may result in a reduction of AC Reff of about 200 ohms (with increased doping of S/D regions in nFET).

The main reason to utilize pre-doping or an increase in S/D doping is to increase the doping at the a-Si/metal interface to reduce the gate contact resistance, Rco. The issue of gate contact resistance is analogous to the issue of diffusion contact resistance (diffusion Rco). Similarly, scaling is limited by diffusion Rco which is dependent on the schottky barrier height (SBH). Since diffusion Rco depends on SBH, reducing SBH will reduce diffusion Rco and improve device performance.

Current techniques developed by one or more of the inventors for reducing SBH at the S/D contacts employ impurity segregation at the silicide/semiconductor (e.g., NiSi/Si) interface. The segregated layer, which could use for example impurities like As, B, In, Sb, N, Cl, S, Se, Al, Dy, Yb, Yt, etc., either passivates the surface or creates interface dipoles to reduce the SBH.

Accordingly, there is a need for an improved fabrication process (and resulting devices) that lowers contact Rco (and decreases AC Reff) and improves device performance. Also needed is a high-K/metal/a-Si gate stack with a segregated layer structure (metal/a-Si) to reduce contact Rco.

SUMMARY

In accordance with one embodiment, there is provided a method of forming a semiconductor device. The method includes providing a semiconductor substrate with dopants of a first conductivity type and forming first and second source/drain (S/D) regions with dopants of a second conductivity type. A high-K/metal gate stack is formed by forming a gate dielectric having a high dielectric constant (K), depositing metal to form a metal gate electrode, and forming a gate contact layer. An impurity layer is formed between the metal gate electrode and the gate contact layer and an anneal process is performed to convert the impurity layer into a segregation layer.

In accordance with another embodiment, there is provided a semiconductor device having a semiconductor substrate of a first conductivity type and a field-effect transistor (FET) structure formed on the substrate. The FET structure includes a first source/drain (S/D) region and a second S/D region each of a second conductivity type, and a gate stack structure including a gate dielectric, a gate electrode, and a gate contact layer. A segregation layer comprises an impurity, and the segregation layer is disposed between the gate electrode and the gate contact layer.

In yet another embodiment, there is provided a method of forming a field-effect transistor (FET) structure having reduced gate contact resistance. The method includes forming a gate stack structure on a semiconductor substrate having dopants of a first conductivity type, the gate structure including a gate dielectric and a metal gate electrode; forming a first source/drain (S/D) region having dopants of a second conductivity type and positioned proximate the gate structure; forming a second S/D region having dopants of the second conductivity type and positioned proximate the gate structure; forming a gate contact layer above the metal gate electrode; forming an impurity region between the metal gate electrode and the gate contact layer; and after forming the impurity region, performing an anneal process to form impurity region into a segregation layer that segregates the metal gate electrode from the gate contact layer.

Other technical features may be readily apparent to one skilled in the art from the following figures, descriptions, and claims.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 2:
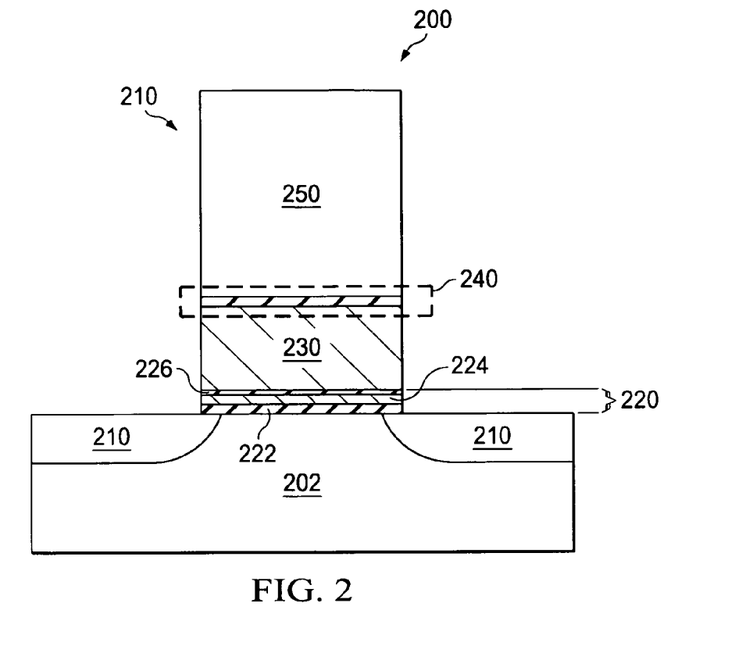
FIG. 2 is a cross-sectional view depicting a FET structure in accordance with the present disclosure.

Referring to FIG. 2, there is depicted a cross-sectional view of a FET semiconductor device 200 formed on a substrate 202 in accordance with the present disclosure. The FET device 200 can be structured as either an n-type or p-type FET. As will be appreciated, the structures and regions shown in the FIGURES are not drawn to scale or actual form, and are for illustrative purposes.

Substrate 202 may include, for example, silicon, silicon-on-insulator (SOI), epitaxial silicon-germanium channel on Si substrate, or other suitable semiconductor substrate materials, now known or later developed. The substrate 202 may include silicon (e.g., n-type, p-type, or no type) provided in a single well or twin-well process, and may further include an epitaxial layer.

The FET 200 includes a gate stack 210 having various regions or layers. Two n-type (or p-type) regions form the source/drain (S/D) regions 210, which include either n-type (or p-type) dopants (while the substrate 202 includes dopants of an opposite conductivity type). The gate stack 210 is considered a high-K/metal/a-Si gate stack, and includes a gate dielectric layer 220, a metal gate electrode 230 and a gate contact region/layer 240. Though not shown, the S/D regions 210 may include a S/D extension region and a deep S/D region. In addition, and again not shown, the gate stack may include sidewall spacers, as known to those skilled in the art.

The gate dielectric 220 layer may be a single layer of high-K (high dielectric constant) dielectric material or multiple layers of dielectric materials (which overall form a high-K dielectric gate). In one embodiment, the gate dielectric 220 includes a first layer of silicon oxynitride (SiON) 222, a second layer of hafnium silicon oxynitride (HfSiON) 224, and a third layer of lanthanum oxide ($La_2O_3$) 226. Other layers and materials may be utilized (shown is a typical dielectric stack for an nFET, and a pFET may be different such as substituting TiN/AL/TiN for the lanthanum oxide layer). In different and varying embodiments, the thickness of the layers may be in the ranges of: SiON—about 5 to about 15 angstroms; HfSiON—about 15 to about 25 angstroms; $La_2O_3$—about 3 to 5 angstroms; and TiN—about 30 to about 60 angstroms.

Disposed above and in contact with the gate dielectric 220 is the metal gate electrode 230 formed to include metal. In one embodiment, the gate electrode 230 includes metal silicide, and in one particular embodiment is titanium nitride. As will be appreciated, the metal silicide may include any suitable metal. In the embodiment shown, the gate electrode 230 contacts the $La_2O_3$ layer 226 of the gate dielectric 220.

Disposed above the gate electrode 230 is a segregation region or layer 240 formed to include one or more impurities. Examples of such impurities may include As, B, In, Sb, N, Cl, S, Se, Al, Dy, Yb, Yt, and the like. In two specific embodiments, the impurity is nitrogen (N) or aluminum (Al). Disposed above the segregation layer 240 is the gate contact layer 250 which, in one embodiment, is amorphous silicon which will eventually become polysilicon. The segregation layer 240 functions as (or provides) an interface or buffer layer between the gate electrode layer 230 and the gate contact layer 250 and is intended to reduce gate contact resistance in the device 200. In different and varying embodiments, the thickness of the metal gate electrode 230 (e.g., TiN) may be in the range of about 30 to about 60 angstroms, while the thickness of the gate contact layer 250 (e.g. a-Si) may be in the range of about 300 to about 700 angstroms.

As will be understood, most of the semiconductor device 200 may be formed using conventional processes, and a method or process will be described below by which the device 200 may be fabricated to achieve reduced gate contact resistance and improve device performance.

Now referring to FIGS. 3A-3D, there is illustrated one method or process 300 of fabricating the FET device 200 in accordance with the present disclosure. In general terms, this new process provides more effective SBH engineering of the device by minimizing impurity diffusion, achieving peak or high impurity concentration and/or high impurity activation at the interface (segregation region 240) between the gate electrode 230 and the gate contact layer 250 within the gate stack 210.

Figure 3A:
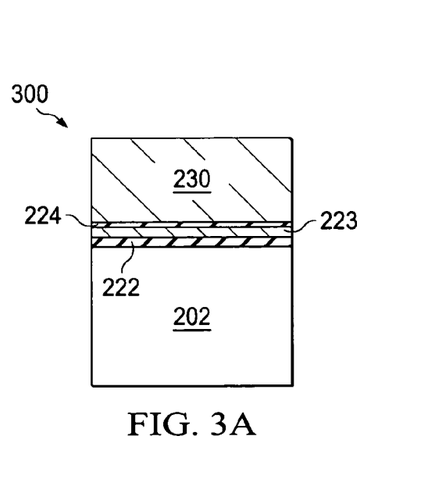
FIGS. 3A-3D illustrate a method or process for forming a high-K/metal/a-Si gate stack in accordance with the present disclosure.

The process 300 includes conventional processing steps up to the formation of the high-K/metal gate stack 210. The gate dielectric layer 220, including the SiON (222), HfSiON (224) and $La_2O_3$ (226) layers, are formed by a suitable process. Metal (including metal alloy(s) or compounds) is deposited on at least a portion of the gate dielectric 220 (more particularly, the $La_2O_3$ layer 226). The metal may be any suitable metal, including a metal to form a metal silicide (by an annealing process) in the gate stack 210, and in specific embodiments, may be titanium or titanium nitride, or any combination of these, or other metals and metal silicides, such as tantalum or tantalum nitride. The structure resulting from the above process is illustrated in FIG. 3A. It will also be understood that other embodiments, the metal gate electrode 230 may be metal, without any silicide formed contemporaneously therewith (and a post metal anneal may be performed).

Figure 3B:
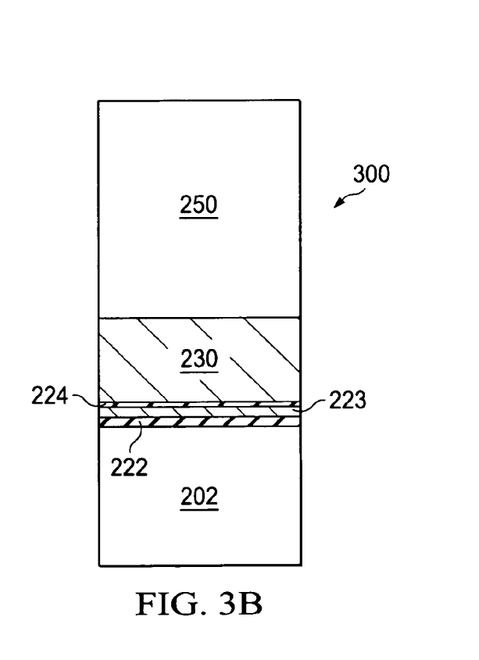

After formation of the high-K/metal gate, amorphous silicon (a-Si) is deposited by any suitable process on the gate electrode 230 and forms the gate contact layer 250. The a-Si may be undoped, pre-doped or later doped, and may be pre-doped with other dopants by insitu doping or implantation. Alternatively, doping may be accomplished by using S/D implants later in the process. In such embodiments, the goal of this doping step is to achieve uniform dopant concentration throughout the a-Si. As will be appreciated, doping to produce the segregated layer 240 is described below. The resulting structure (high-K/metal/a-Si) is shown in FIG. 3B.

Figure 3C:
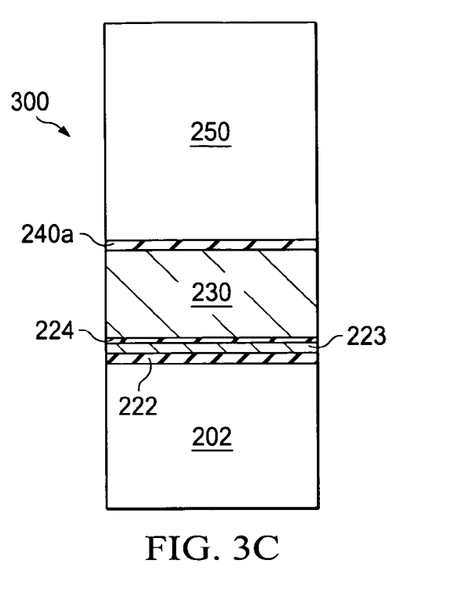

Impurities, which may include dopant and/or metal, are implanted near or at the interface between the gate electrode 230 and the gate contact layer 250. The implanted impurities form a thin implanted impurity layer 240a. The resulting structure (high-K/metal/impurities/a-Si) is shown in FIG. 3C. It is desirable to implant the impurities in a thin region substantially at the interface. In certain embodiments, the thickness of the segregation layer 240 may be in the range of about 10 to about 50 angstroms.

The implantation of these impurities, as described above, may also be referred to as schottky barrier height (SBH) engineering implantation (for decreasing the barrier height). This implantation increases peak concentration around the metal/metal-silicide-silicon (amorphous) interface (in the segregation region 240). Examples of suitable impurities may include As, B, In, Sb, N, Cl, S, Se, Al, Dy, Yb, Yt, and the like. In one embodiment, the impurity is aluminum (Al) and in another specific embodiment, the impurity is nitrogen (N). During the implantation process, the implanted impurities are imparted with an energy level in an effort to generate peak impurity levels at or near the interface between the TiN (230) and the a-Si (250). The implant energy will depend on the thickness of the a-Si (250). The goal is to produce a specific distribution (depth) into the a-Si layer 250 at about the interface with the TiN (230). Implant energy levels may range from a few eV to a few hundred keV, depending on the targeted a-Si thickness to be formed and the implant species. Implant dosage may range from about $1 \times 10^{13}$ cm$^2$ to $1 \times 10^{16}$ cm$^2$, depending on the implant species, as well.

In the previous embodiment, the SBH engineering implant is implanted after high-K/metal gate/a-Si stack formation (e.g., deposition) but before gate etch. In another embodiment, impurity implant may occur after gate etch and S/D formation. In another embodiment, the SBH engineering implant may be performed just before or after S/D silicidation. In yet another embodiment, the implantation may be performed during intermediate steps of the S/D silicidation process (e.g., deposition of metal for silicidation, rapid thermal anneal process, removal of unreacted metal, SBH impurity implant, second rapid thermal anneal, and laser/dynamic spike annealing.

Figure 3D:
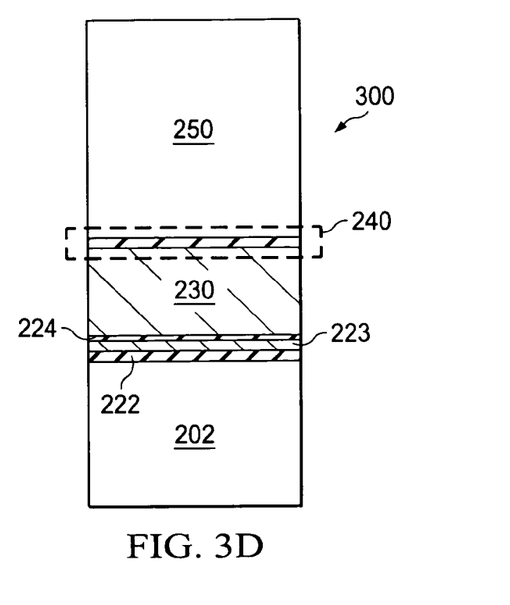

One or more anneal process steps convert or form the implanted layer 240a into the segregation layer 240. FIG. 3D illustrates the gate stack 210 with the segregation layer or region 240 after an anneal process. As will be appreciated, the anneal process may be performed immediately after the impurities are implanted, or the anneal process may be accomplished by one or more standard annealing steps performed during later processing, e.g., S/D activation anneal, or the immediate anneal process may be assisted by the one or more later standard annealing steps.

If the anneal step is performed immediately after implantation, a furnace anneal, rapid thermal process (RTA), spike anneal (e.g., laser spike anneal (LSA) or dynamic spike anneal (DSA)) may be performed to convert or form the segregation layer 240. The spike anneal process may be a laser spike annealing (LSA) process or a dynamic spike annealing (DSA) process, or other known spike anneal process, and may be a flash anneal. LSA and DSA work in such a way that it ramps up the temperature of the applied region from a floor (e.g., ambient) temperature to the intended temperature in a short period of time. The main difference between LSA and DSA is that DSA has a shorter dwell time, i.e., this process is able to achieve the intended temperature in a shorter time period than LSA. Thus, a "spike anneal" process is described as an anneal process in which the temperature is raised to the intended temperature in a short period of time, such as less than about 5 seconds, and in some embodiments less than about 1 second. Due to the short duration and meta-stable state induced by LSA/DSA, diffusion is minimized and the impurity is highly activated—aiding in the surface passivation of dangling bonds and/or impurity segregation at the interface (between the gate electrode region 230 and the gate contact layer 250) which lowers SBH.

As will be appreciated, any suitable implantation process may be used, and cluster, molecular or plasma implants may be employed to form sharper and/or shallower impurity profiles.

The above described method 300 aids in the fabrication of the FET structure 200 through reductions in gate contact resistance (by decreasing SBH). In sum, this reduces the series contact resistance of the device 200 and improves device performance by lowering AC Reff.

Now referring to FIGS. 4A-4E, there is illustrated another method or process 400 of fabricating the FET device 200 in accordance with the present disclosure. In general terms, this process 400 is similar to the process 300 except the gate contact layer (a-Si) 250 is formed using a two-step process and the implantation layer 240a is formed between the two steps.

Figure 4A:
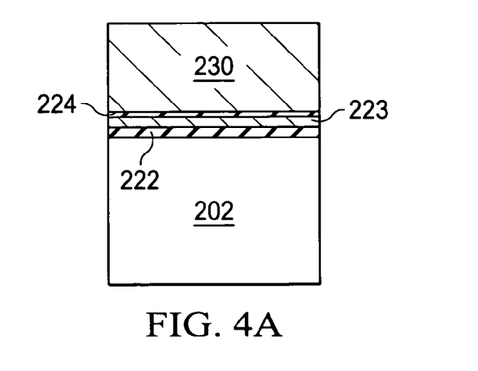
FIGS. 4A-4E illustrate another method or process for forming a high-K/metal/a-Si gate stack in accordance with the present disclosure.

The high-K/metal gate electrode illustrated in FIG. 4A is formed in the same manner at that described above with respect FIG. 3A.

Figure 4B:
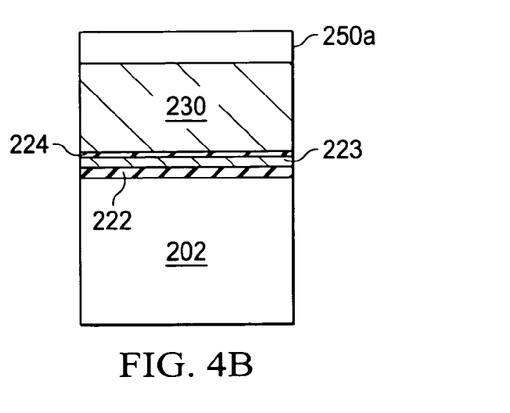

After formation of the high-K/metal gate, a first layer of amorphous silicon (a-Si) is deposited by any suitable process on the gate electrode 230 and forms the gate contact layer 250a. The resulting structure (high-K/metal/a-Si) is shown in FIG. 4B.

Figure 4C:
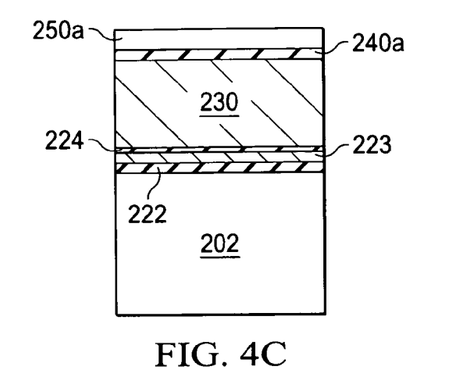

Next, the impurities are implanted near or at the interface between the gate electrode 230 and the gate contact layer 250a and form the thin implanted impurity layer 240a. The resulting structure (high-K/metal/impurities/first layer of a-Si) is shown in FIG. 4C.

Figure 4D:
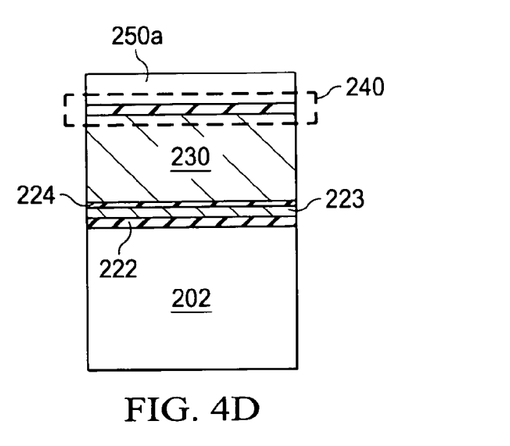

One or more anneal process steps convert or form the implanted layer 240a into the segregation layer 240. FIG. 4D illustrates the gate stack 210 with the segregation layer or region 240 after an anneal process.

As will be appreciated, the anneal process may be performed immediately after the impurities are implanted, or the anneal process may be accomplished by one or more standard annealing steps performed during later processing, e.g., S/D activation anneal, or the immediate anneal process may be assisted by the one or more later standard annealing steps.

Figure 4E:
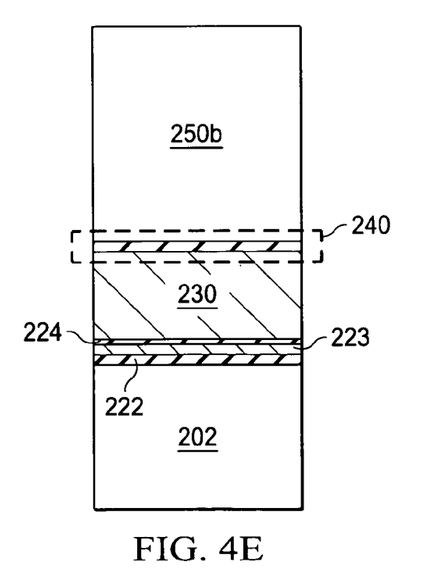

After formation of the segregation layer 240, a second layer of amorphous silicon (a-Si) is deposited by any suitable process on the gate electrode 230 and forms the gate contact layer 250b. These two a-Si layers 250a, 250b form the gate contact layer 250. The a-Si layer(s) may be undoped, pre-doped or later doped, and may be pre-doped with other dopants by insitu doping or implantation. Alternatively, doping may be accomplished by using S/D implants later in the process. The resulting structure (high-K/metal/segregation layer/a-Si) is shown in FIG. 4E. The thicknesses of the layers 250a and 250b may be any suitable thicknesses, and in one embodiment, the first layer 250a is thinner than the second layer 250b.

The anneal step represented by FIG. 4D may be optionally omitted, and annealing may be performed at a later stage (after the gate contact layer 250 is formed). For example it may be accomplished by one or more standard annealing steps performed during later processing, e.g., S/D activation anneal. In yet another embodiment, the immediate anneal process may be performed and assisted by the one or more later standard annealing steps.

Now referring to FIGS. 5A-5D, there is illustrated another method or process 500 of fabricating the FET device 200 in accordance with the present disclosure. In general terms, this process 500 is similar to the process 300 except the segregation layer is deposited, instead of implanted.

Figure 5A:
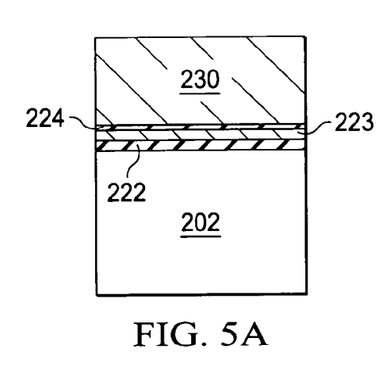
FIGS. 5A-5D illustrate another embodiment of a method or process for forming a high-K/metal/a-Si gate stack in accordance with the present disclosure.

The high-K/metal gate electrode illustrated in FIG. 5A is formed in the same manner at that described above with respect FIG. 3A.

Figure 5B:
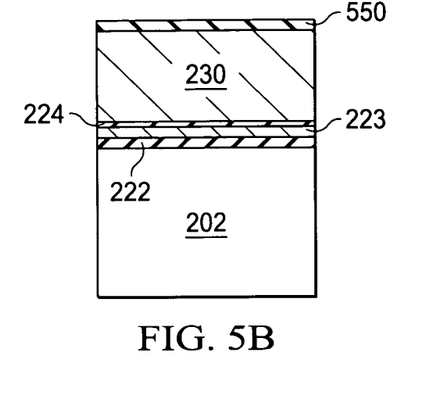

After formation of the high-K/metal gate, impurities deposited by any suitable process on the gate electrode 230 and form an impurity (or solid source) layer 550. The resulting structure (high-K/metal/impurity layer) is shown in FIG. 5B. Example solid sources that may be suitable include Sb, Al and other metals.

Figure 5C:
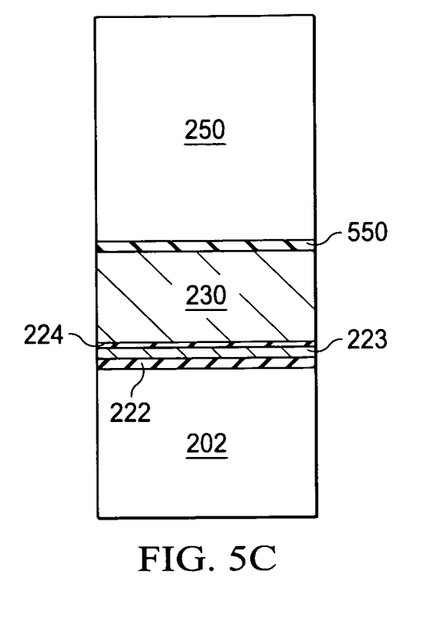

Next, a layer of a-Si is formed and disposed above the impurity layer 550 to form the gate contact layer 250. The a-Si layer may be undoped, pre-doped or later doped, and may be pre-doped with other dopants by insitu doping or implantation. Alternatively, doping may be accomplished by using S/D implants later in the process. The resulting structure (high-K/metal/impurity layer/a-Si) is shown in FIG. 5C.

Figure 5D:
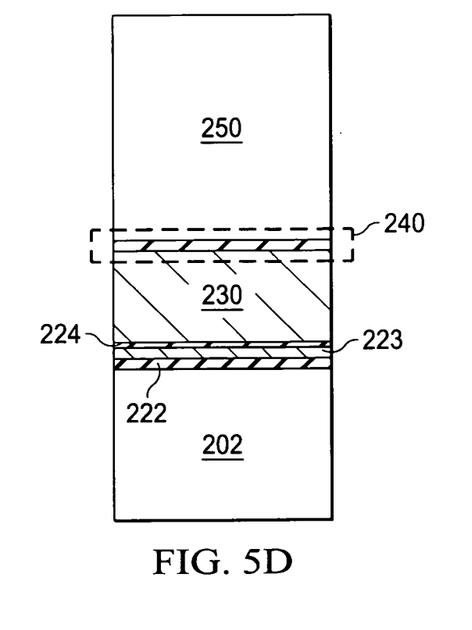

One or more anneal process steps convert or form the impurity layer 550 into the segregation layer 240. FIG. 5D illustrates the gate stack 210 with the segregation layer or region 240 after an anneal process.

The anneal step represented by FIG. 5D may be optionally omitted, and annealing may be performed at a later stage. For example it may be accomplished by one or more standard annealing steps performed during later processing, e.g., S/D activation anneal. In yet another embodiment, the immediate anneal process may be performed and assisted by the one or more later standard annealing steps.

It will be understood that some of processes/steps described above to form the segregation layer 240, e.g., the anneal process, may be performed either prior to or after S/D contact silicidation.

The order of steps or processing can be changed or varied form that described above, unless otherwise described above (or in the claims below). It will be understood that well known process have not been described in detail and have been omitted for brevity. Although specific steps, insulating materials, conductive materials and apparatuses for depositing and etching these materials may have been described, the present disclosure may not limited to these specifics, and others may substituted as is well understood by those skilled in the art.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of forming a semiconductor device, the method comprising:
    providing a semiconductor substrate with dopants of a first conductivity type;
    forming first and second source/drain (S/D) regions with dopants of a second conductivity type;
    forming a high-K/metal gate stack, wherein forming the high-K/metal gate stack further comprises,
        forming a gate dielectric having a high dielectric constant (K),
        forming a metal nitride layer above the gate dielectric, and
        forming a gate contact layer of amorphous silicon above, and in contact with, the metal nitride layer;
    forming an impurity layer between the metal nitride layer and the gate contact layer, the impurity layer comprising an impurity; and
    performing an anneal process to convert the impurity layer into a segregation layer.

2. The method in accordance with claim 1 wherein the impurity comprises at least a one of: nitrogen or aluminum.

3. The method in accordance with claim 1 wherein the anneal process is at least a one of: laser spike annealing (LSA) or dynamic spike annealing (DSA) or rapid thermal annealing (RTA).

4. The method in accordance with claim 1 wherein forming the gate dielectric further comprises:
    forming a layer of silicon oxynitride (SiON);
    forming a layer of hafnium silicon oxynitride (HfSiON); and
    forming a layer of lanthanum oxide (La$_2$O$_3$).

5. The method in accordance with claim 1 wherein forming the impurity layer comprises:
    implanting impurities through at least a portion of the gate contact layer near an interface between the metal nitride layer and the gate contact layer.

6. The method in accordance with claim 1 wherein forming the gate contact layer and forming the impurity layer further comprise:
    forming a first layer of the gate contact layer;
    implanting impurities through at least a portion of the first layer of the gate contact layer near an interface between the metal gate electrode and the first layer of the gate contact layer; and
    after implanting the impurities, forming a second layer of the gate contact layer on top of the first layer of the gate contact layer.

7. The method in accordance with claim 1 wherein forming the impurity layer further comprises:
    depositing impurities on the gate electrode, and wherein the gate contact layer is formed on the impurity layer.

8. A semiconductor device comprising:
    a semiconductor substrate of a first conductivity type; and
    a field-effect transistor (FET) structure formed on the substrate, the FET structure comprising,
        a first source/drain (SID) region and a second S/D) region each of a second conductivity type, and
        a gate stack structure including a gate dielectric, a metal nitride layer disposed above the gate dielectric, and a gate contact layer formed with amorphous silicon above, and in contact with, the metal nitride layer;
        a segregation layer comprising an impurity, wherein the segregation layer is disposed between the metal nitride layer and the gate contact layer.

9. The device in accordance with claim 8 wherein the impurity comprises at least a one of: nitrogen, aluminum or antimony.

10. The device in accordance with claim 8 wherein the gate dielectric further comprises:
    a first layer comprising silicon oxynitride (SiON); and
    a second layer comprising silicon oxynitride (SiON).

11. The device in accordance with claim 10 wherein the second layer of SiON comprises hafnium SiON.

12. The device in accordance with claim 10 wherein the gate dielectric further comprises a layer of at least a one of: lanthanum oxide or TiN/Al/TiN.

13. A method of forming a field-effect transistor (FET) structure having reduced gate contact resistance, the method comprising:
    forming a gate stack structure on a semiconductor substrate having dopants of a first conductivity type, the gate structure including a gate dielectric and a metal nitride layer;

forming a first source/drain (S/D) region having dopants of a second conductivity type and positioned proximate the gate structure;

forming a second S/D region having dopants of the second conductivity type and positioned proximate the gate structure;

forming a gate contact layer of amorphous silicon above, and in contact with, the metal nitride layer;

forming an impurity region between the metal nitride layer and the gate contact layer; and after forming the impurity region, performing an anneal process to form impurity region into a segregation layer that forms dipoles to reduce schottky barrier height (SBH) between the metal gate electrode and the gate contact layer.

14. The method in accordance with claim 13 wherein the impurity comprises at least a one of: nitrogen or aluminum.

15. The method in accordance with claim 13 wherein the anneal process is at least a one of: laser spike annealing (LSA) or dynamic spike annealing (DSA) or rapid thermal annealing (RTA).

16. The method in accordance with claim 15 wherein forming the gate contact layer and forming the impurity layer further comprise:

forming a first layer of the gate contact layer;

implanting impurities through at least a portion of the first layer of the gate contact layer near an interface between the metal gate electrode and the first layer of the gate contact layer; and after implanting the impurities, forming a second layer of the gate contact layer on top of the first layer of the gate contact layer.

17. The method in accordance with claim 13 wherein forming the impurity region comprises:

implanting impurities through at least a portion of the gate contact layer near an interface between the metal nitride layer and the gate contact layer.

18. The method in accordance with claim 13 wherein forming the impurity layer further comprises:

depositing impurities on the gate electrode, and wherein the gate contact layer is formed on the impurity layer.

* * * * *